(12) United States Patent
Pentlehner et al.

(10) Patent No.: US 10,581,009 B2
(45) Date of Patent: Mar. 3, 2020

(54) ORGANIC LIGHT-EMITTING COMPONENT AND METHOD FOR PRODUCING AN ORGANIC LIGHT-EMITTING COMPONENT

(71) Applicant: OSRAM OLED GmbH, Regensburg (DE)

(72) Inventors: Dominik Pentlehner, Burghausen (DE); Carola Diez, Regensburg (DE); Daniel Riedel, Munich (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 15/999,601

(22) PCT Filed: Feb. 17, 2017

(86) PCT No.: PCT/EP2017/053663
§ 371 (c)(1),
(2) Date: Aug. 17, 2018

(87) PCT Pub. No.: WO2017/140873
PCT Pub. Date: Aug. 24, 2017

(65) Prior Publication Data
US 2019/0044081 A1 Feb. 7, 2019

(30) Foreign Application Priority Data

Feb. 19, 2016 (DE) .................... 10 2016 102 964

(51) Int. Cl.
*H01L 51/50* (2006.01)
*H01L 27/32* (2006.01)
(Continued)

(52) U.S. Cl.
CPC ........ *H01L 51/504* (2013.01); *H01L 27/3209* (2013.01); *H01L 51/5056* (2013.01);
(Continued)

(58) Field of Classification Search
None
See application file for complete search history.

(56) References Cited

U.S. PATENT DOCUMENTS

| 2004/0224182 A1 | 11/2004 | Lazarev |
| 2012/0003485 A1 | 1/2012 | Habich et al. |
| 2013/0264545 A2 | 10/2013 | Von Wrochem et al. |

FOREIGN PATENT DOCUMENTS

| DE | 102012203583 A1 | 9/2013 |
| DE | 102013113533 A1 | 6/2015 |

(Continued)

OTHER PUBLICATIONS

D. Yokoyama, "Molecular orientation in small-molecule organic light-emitting diodes" J. Mater. Chem., 2011, 21, 19187.
(Continued)

*Primary Examiner* — Asok K Sarkar
(74) *Attorney, Agent, or Firm* — McDermott Will & Emery LLP (57) ABSTRACT

The invention relates to an organic light-emitting device comprising an organic stack of layers between two electrodes. The organic stack of layers comprises a first light-emitting layer and the first light-emitting layer comprises an emitter material adapted to generate electromagnetic radiation during operation of the device. Taken together, the transition dipole moments of the radiation generating transition of the molecules of the emitter material have an anisotropic orientation inside the first light-emitting layer, and it applies that $<\cos^2\theta>$ is less than ⅓, where θ is the angle between the respective transition dipole moment of the radiation generating transition of the molecules of the emitter material and a layer normal of the first light-emitting layer.

14 Claims, 7 Drawing Sheets

(51) Int. Cl.
H01L 51/52 (2006.01)
H01L 51/00 (2006.01)

(52) U.S. Cl.
CPC ...... H01L 51/5072 (2013.01); H01L 51/5203 (2013.01); H01L 51/5293 (2013.01); H01L 51/0085 (2013.01); H01L 51/0086 (2013.01); H01L 51/5012 (2013.01)

(56) References Cited

FOREIGN PATENT DOCUMENTS

| DE | 102015108826 A1 | 12/2016 |
| DE | 102015114084 A1 | 3/2017 |
| JP | 2013-026301 A | 2/2013 |

OTHER PUBLICATIONS

M. C. Gather et al, "Recent advances in light outcoupling from white organic light-emitting diodes" Journal of Photonics for Energy, vol. 5 2015.

Ogiwara et al., "Efficiency improvement of fluorescent blue device by molecular orientation of blue dopant" Journal of the SID 22/01, 2014.

"glossary of terms used in photochemistry" The "Gold Book", DOI: 10.1351/goldbook.T06460 Oct. 10, 2006.

"transition (dipole) moment" DOI: 10.1351/goldbook.T06460 2014 IUPAC.

Brütting et al., "Device efficiency of organic light-emitting diodes: Progress by improved light outsoupling" Phys. Status Solidi A, No. 1, 44-65 (2013).

Gupta, "Organic Electronics II" Department of Materials and Metallurgical Engineering & Samtel Centre for Display Technologies, 111-117, downloaded Jul. 3, 2018.

ORGANIC LIGHT-EMITTING COMPONENT AND METHOD FOR PRODUCING AN ORGANIC LIGHT-EMITTING COMPONENT

CROSS-REFERENCE TO RELATED APPLICATIONS

This application is the U.S. National Phase under 35 U.S.C. § 371 of International Patent Application No. PCT/EP2017/053663, filed on Feb. 17, 2017, which in turn claims the benefit of German Application No. 10 2016 102 964.5, filed on Feb. 19, 2016, the entire disclosures of which Applications are incorporated by reference herein.

DESCRIPTION

An organic light-emitting device is provided. Furthermore, a method for producing an organic light-emitting device is provided.

In organic light-emitting devices, such as organic light-emitting diodes (OLEDs), only part of the electromagnetic radiation generated in the light-emitting layer is coupled outwards to the environment. The remaining part of the radiation is distributed over various loss channels, for example in radiation that is guided in the substrate or in organic layers by waveguide effects, and surface plasmons that can be generated in a metallic electrode. The waveguide effects are mainly caused by refractive index differences at the interfaces of the individual layers and to the ambient air of an OLED. Usually the external quantum efficiency is about 22% at an assumed internal quantum efficiency of 100%, i.e. only about a quarter of the generated radiation is coupled outwards to the environment, while the rest is lost by waveguide effects. The radiation conducted in the loss channels cannot be coupled outwards from an organic light-emitting device, especially without technical measures.

A task to be solved is to provide an organic light-emitting device that has increased efficiency and light extraction and emits radiation with an increased degree of polarization. Another task is to provide a method of manufacturing an organic light-emitting device.

The tasks are solved by the organic light-emitting device and the method of manufacturing an organic light-emitting device according to the independent patent claims.

Advantageous embodiments as well as further embodiments of the present invention are provided in the respective dependent claims.

According to at least one embodiment, the organic light-emitting device has an organic stack of layers between two electrodes. The organic stack of layers comprises a first light-emitting layer. The first light-emitting layer comprises an emitter, material, which is adapted to generate electromagnetic radiation during operation of the device.

According to an embodiment, the emitter material is adapted to generate electromagnetic radiation in the visible region of the electromagnetic spectrum. In particular, the generated electromagnetic radiation is radiated to the outside.

According to an embodiment, the electromagnetic radiation is emitted to the outside via a radiation exit surface. The radiation exit surface is a major surface of the layer sequence. The radiation exit surface extends in particular parallel to a main extension plane of the layers of the layer sequence. With an assumed internal quantum efficiency of 100%, an external quantum efficiency of about 35% can be achieved according to the invention.

According to an embodiment, the emitter material is aligned or oriented in the first light-emitting layer. This means that the emitter material is arranged anisotropically, i.e. with a preferred direction in the first light-emitting layer.

According to an embodiment, the emitter material comprises molecules of the emitter material. The molecules of the emitter material each have a transition dipole moment of the radiation-generating transition.

The transition dipole moment has a fixed direction in the coordinate system of the emitter material (molecular coordinate system). This means, in particular, that by orientating the emitter material in the first light-emitting layer, that is to say in space, its transition dipole moment of the radiation-generating transition is also orientated.

The term transition dipole moment is referred to in particular: "IUPAC. Compendium of Chemical Terminology, Second Edition (The "Gold Book"), 1997 respectively IUPAC. Compendium of Chemical Terminology, P A C, 2007, 79, 293 (Glossary of terms used in photochemistry, third edition (IUPAC Recommendations 2006)) auf page 434, DOI: 10.1351/goldbook.T06460. The disclosure of the documents is incorporated by reference.

According to at least one embodiment, the transition dipole moments of the radiation-generating transition of the molecules of the emitter material taken together are of a preferred direction within the first light-emitting layer and are therefore taken together anisotropically oriented.

According to at least one embodiment, the transition dipole moments of the radiation-generating transition of the molecules of the emitter material are arranged taken together perpendicular to a layer normal of the first light-emitting layer with a maximum deviation of +/−45° from this perpendicular orientation. The layer normal of the first light-emitting layer designates here and below a preferred direction, which is arranged perpendicular to the first light-emitting layer.

The fact that the transition dipole moments of the molecules of the emitter material taken together have anisotropic orientation within the first light-emitting layer means here and below that the majority of the molecules of the emitter material have a preferred direction, i.e. in particular at least 50%, 60%, 70%, 80%, 90% or 95% and at most 100% of all molecules of the emitter material. Preferably, at least 50%, 60%, 70%, 80%, 90% or 95% and at most 100% of all molecules of the emitter material are arranged perpendicular to a layer normal of the first light-emitting layer with a maximum deviation of +/−45° from this perpendicular orientation.

According to an embodiment, the emitter material or the molecules of the emitter material is oriented or aligned in the first light-emitting layer. By oriented or aligned is meant here and below that the emitter material and/or the molecules of the emitter material and/or the transition dipole moment of the radiative transition of the molecules occupy a preferred direction in the first light-emitting layer. In particular, the transition dipole moments are taken together arranged perpendicular to the layer normal of the first light-emitting layer. The transition dipole moments of the molecules may be combined alternatively or additionally with a deviation of up to +/−45°, for example +/−40°, +/−35°, +/−30°, +/−25°, +/−20°, +/−15°, +/−10° or +/−5° from this perpendicular orientation. In particular, on average all transition dipole moments of the radiative transitions of the molecules have a perpendicular arrangement +/−45° to the layer normal of the first light-emitting layer.

As a measure of the orientation of molecules, the orientation factor $K_\theta = \langle \cos^2 \theta \rangle$ can be used. The term orientation factor is especially referred to: IUPAC. Compendium of Chemical Terminology, P A C, 2007, 79, 293 (Glossary of terms used in photochemistry, third edition (IUPAC Recommendations 2006), on page 371, DOI: 10.1351/goldbook.MT07422). The disclosure of the document is incorporated by reference.

That the transition dipole moments of the molecules of the emitter material have anisotropic orientation means in particular that the orientation factor $K_\theta$ is less than ⅓. The angle $\theta$ is the angle between the respective transition dipole moment of the molecules of the emitter material and a layer normal N, wherein the layer normal N is arranged perpendicular to the first light-emitting layer. The orientation factor $K_\theta$ is averaged over all molecules of the emitter material. In particular, $<\cos^2 \theta>$ is less than 0.2; 0.1; 0.015; 0.001 or 0. In particular, the transition dipole moments are taken together arranged perpendicular to the layer normal with a maximum deviation of +/−45° from this perpendicular orientation.

By means of this anisotropic transition dipole moments, which are arranged in particular perpendicular to a layer normal of the first light-emitting layer, the radiation generated by the dipole transition also has a preferred direction and thus an anisotropy. Furthermore, the radiation is polarized, that is, it has a higher degree of polarization than unpolarized radiation. The radiation emitted by the emitter material is preferably emitted with a polarization direction parallel to the transition dipole moment. In particular, the generated radiation strikes the radiation exit surface at an angle perpendicular or nearly perpendicular to the radiation exit surface. As a result, total reflection at the interface with the ambient air as well as waveguide effects can be significantly reduced. This provides an organic light-emitting device with increased light extraction and thus increased efficiency. A polarization of the radiation may be important, for example, in the use of the organic light-emitting device in a display. If the generated radiation is already polarized, the use of polarizing filters can be dispensed with and thus the entire generated radiation can be used without filtering.

According to at least one embodiment, all molecules of the emitter material have a transition dipole moment that is oriented perpendicular to the layer normal of the light-emitting layer with a maximum deviation of +/−45° from this perpendicular orientation, for example 30°.

According to at least one embodiment, at least 50% or 60% or 70% or 80% or 90% or 95% of all molecules of the emitter material have a transition dipole moment of the radiation-generating transition which is arranged perpendicular to the layer normal of the first light-emitting layer with a maximum deviation of +/−45° from this perpendicular orientation.

According to at least one embodiment, the organic light-emitting device is an organic light-emitting diode (OLED).

According to an embodiment, the organic functional stack of layers comprises, in addition to the first light emitting layer, a plurality of organic functional layers selected from further light emitting layers, hole injecting layers, hole transporting layers, electron injecting layers, electron transporting layers, hole blocking layers and electron blocking layers.

According to at least one embodiment, the organic light-emitting device has at least two electrodes, between which the organic stack of layers is arranged.

According to at least one embodiment, at least one of the electrodes is transparent. With transparent here and in the following a layer is designated, which is transmissive to visible light. In this case, the transparent layer can be clear, translucent or at least partially light-scattering and/or partially light-absorbing, so that the transparent layer can also be translucent, for example, diffuse or milky. Particularly preferably, a layer designated here as transparent is as transparent as possible, so that in particular the absorption of electromagnetic radiation generated in the operation of the device in the first light-emitting layer is as low as possible.

According to at least one embodiment, both electrodes are transparent. Thus, the light generated in the first light-emitting layer can be radiated in both directions, that is through both electrodes. In the event that the organic light-emitting device has a substrate, this means that the radiation can be emitted both through the substrate, which is then likewise transparent, and in the direction away from the substrate. Furthermore, in this case, all layers of the organic light-emitting device can be made transparent, so that the organic light-emitting device forms a transparent OLED. Moreover, it may also be possible for one of the two electrodes, between which the organic functional stack of layers is arranged, to be non-transparent and preferably reflective, so that the light generated in the first light-emitting layer between the two electrodes only can be radiated through the transparent electrode in one direction. If the electrode arranged on the substrate is transparent and the substrate is also transparent, then this is also referred to as a bottom emitter, whereas in the case where the arranged electrode facing away from the substrate is transparent, this is referred to as a so-called top emitter.

As the material for a transparent electrode, for example, a transparent conductive oxide may be used. Transparent conductive oxides (TCOs) are transparent conductive materials, typically metal oxides such as zinc oxide, tin oxide, cadmium oxide, titanium oxide, indium oxide, indium tin oxide (ITO) or aluminum zinc oxide (AZO). In addition to binary metal oxygen compounds such as $ZnO$, $SnO_2$ and $In_2O_3$ also ternary metal oxygen compounds such as $Zn_2SnO_4$, $CdSnO_3$, $ZnSnO_3$, $MgIn_2O_4$, $GaInO_3$, $Zn_2In_2O_5$ and $In_4Sn_3O_{12}$ or mixtures of different transparent conductive oxides belong to the group of TCO. Furthermore, the TCOs do not necessarily correspond to a stoichiometric composition and may also be p- or n-doped.

According to an embodiment, the device has at least one metallic electrode. The metal may be selected from a group comprising aluminum, barium, indium, silver, gold, magnesium, calcium, and combinations thereof and alloys. In particular, the metallic electrode is formed of silver, gold, aluminum or alloys with these metals, for example Ag:Mg or Ag:Ca. The metallic electrode may be designed to be reflective or transparent depending on the selected layer thickness.

By arranging the transition dipole moments of the radiation-generating transition of the molecules of the emitter material perpendicular to the layer normal of the first light-emitting layer, the loss of the radiation generated by plasmon excitation is prevented or at least largely prevented.

A plasmon is understood as meaning a charge carrier density oscillation at the interface of a metallic electrode and an adjacent dielectric, i.e. an organic layer. Due to the generated radiation, free charge carriers, in particular electrons in the metallic electrode, can be excited to charge carrier density oscillations. As a result, part of the generated radiation is lost as a result of the excitation and can therefore no longer be coupled out of the organic light-emitting device. In particular, plasmons in this case designate longitudinal charge carrier density oscillations which occur parallel to the plane of extent of a surface of a metallic electrode on this surface. Plasmons are excited by radiation resulting from transitions with a transition dipole moment oriented parallel to the layer normal of the first light-emitting layer. As a result of the perpendicular orientation or the largely perpendicular orientation of the transition dipole moments of the molecules of the emitter material to the layer normal of the first light-emitting layer, the plasmon excitation can thus be suppressed or largely suppressed. As a result, the proportion of radiation coupled out to the outside of the environment can be increased.

According to an embodiment, the organic light-emitting device has a substrate. In particular, one of the two electrodes is arranged on the substrate. The substrate may comprise, for example, one or more materials in the form of a layer, a plate, a foil or a laminate, which are selected from glass, quartz, plastic, metal, silicon wafers. In particular, the substrate comprises or consists of glass.

According to an embodiment, the organic light-emitting device has a second light-emitting layer. The first and second light-emitting layers may be vertically stacked. Thus, a higher efficiency can be achieved by using a plurality of vertically stacked light-emitting layers. The stacked light emitting layers may be interconnected by a charge generation layer (CGL). Thereby, it may be possible to generate a plurality of photons per carrier pair injected in such a stack since the carrier generation layers of the carrier generation layer sequence act like internal anodes and cathodes. In particular, the carrier generation layer sequence comprises an electron transporting layer, an intermediate layer and a hole transporting layer.

The structure and materials of a carrier generation layer sequence which is arranged between two light-emitting layers are disclosed in the patent application DE 102015114084.5, which is hereby fully incorporated by reference.

Conventional organic emitter materials can be used in the second or each further light-emitting layer. For example, fluorescent or phosphorescent emitter material, such as perylene or tris[2-(p-tolyl)pyridine]iridium (III). In particular, the emitter material can be distributed isotropically in the second or each further light-emitting layer, which means that the molecules of the emitter material can be arranged in the second light-emitting layer without a specific preferred direction.

According to an embodiment, the organic stack of layers comprises a metal layer. The metal layer has a surface. The surface of the metal layer may adjoin the first light-emitting layer. In particular, the metal layer is arranged directly on the first light-emitting layer.

According to an embodiment, the molecules of the emitter material of the first light-emitting layer are bound by covalent bonds to the metal of the metal layer. The emitter material forms a self-assembling monolayer, so-called self-assembly monolayer or SAM. The molecules of the emitter material are aligned or oriented in the first light-emitting layer, that is to say they have a preferred direction. In particular, the orientation factor $K_\theta$ is less' than ⅓. Preferably, the transition dipole moments of the radiation-generating transition of the molecules of the emitter material taken together are arranged perpendicularly to a layer normal of the first light-emitting layer with a maximum deviation of +/−45° from this perpendicular orientation. In other words, the transition dipole moments of the radiating transition taken together are arranged parallel to the radiation exit face with a maximum deviation of +/−45° from this parallel orientation.

According to at least one embodiment, the metal layer comprises a metal or consists of a metal selected from a group comprising copper, silver, gold, platinum, and aluminum. In particular, the metal layer is a thin layer, for example with a layer thickness between 0.1 and 3 nm inclusive. In particular, the metal layer has a layer thickness between 0.1 and 1.5 nm inclusive, for example, 0.4, 0.8 nm or 1 nm. With these layer thicknesses, it can be ensured that the metal layer is transparent and does not have a noticeable influence on the electro-optical characteristics, such as the voltage, of the organic light-emitting device.

According to an embodiment, the molecules of the emitter material are substituted with at least one functional group comprising sulfur or consisting of sulfur.

According to an embodiment, the molecules of the emitter material are substituted with two or more functional groups comprising sulfur or consisting of sulfur. In this case, the functional groups can be attached to the same side of the molecule or to opposite sides of the molecule of the emitter material.

According to an embodiment, the molecules of the emitter material of the first light-emitting layer are bonded to the metal of the metal layer via covalent bonds of the sulfur. In particular, there is a covalent metal-sulfur bond between the metal of the metal layer and the sulfur of the functional group of the emitter material.

In an embodiment, the metal layer is formed of gold with a covalent gold-sulfur bond joining the metal layer and the first light-emitting layer. Thus, the adhesion of the two layers to each other can be improved.

In accordance with at least one embodiment, the emitter material of the first light-emitting layer is formed as a self-assembled monolayer. Due to the high affinity of the sulfur of the functional group of the emitter material to the metal, in particular gold, of the metal layer, the molecules of the emitter material organize themselves in the first light-emitting layer. The molecules thus spontaneously assemble into a highly ordered layer. The metal layer thus serves as a seed layer for the orientation of the molecules of the emitter material. In addition to the covalent bonding of the emitter material to the metal layer, the SAMs additionally undergo lateral stabilization of the layer by noncovalent interaction, such as van der Waals interactions or hydrogen bonds between adjacent molecules.

In an embodiment, the emitter material is substituted with at least one thiol group. In particular, it is a thiol group which forms the sulfur-metal bond after application to the metal layer. In particular, the emitter material may have several, for example two, thiol groups. The thiol groups function here as anchor groups, with the sulfur of the thiol group covalently bonding to the metal layer. In particular, strong covalent bonding results when the metal layer is a gold layer.

The thiol group may, according to an embodiment, be bonded directly to the molecules of the emitter material. However, it is also possible that the thiol group is bonded to the emitter material via a spacer, preferably an aryl or alkyl group, such as, for example, a phenyl, methyl, ethyl or propyl group.

As materials for the emitter material, it is possible to use customary organic emitter materials which are substituted by at least one thiol group.

Thiol groups can be prepared, for example, from a reaction between alcohols and $H_2S$ or between halides and $H_2S$.

In an embodiment, the emitter material is a fluorescent or phosphorescent material. These materials are known to the person skilled in the art. In particular, they are substituted with at least one functional group comprising sulfur or consisting of sulfur. In particular, it is a thiol group which forms the covalent sulfur-metal bond after application. For example, iridium complexes substituted with at least one functional group, such as green phosphorescent Ir(ppy)$_3$ (tris(2-phenylpyridine)iridium III) and/or red phosphorescent Ru(dtb-bpy)$_3$*2(PF$_6$) (tris[4,4'-di-tert-butyl-(2,2')-bipyridine]ruthenium(III)complex); and blue fluorescent DPAVBi (4,4-bis[4-(di-p-tolylamino)styryl] biphenyl), green fluorescent TTPA (9,10-bis[N,N-di(p-tolyl) amino] anthracene) and/or red fluorescent DCM2 (4-dicyano-methylene)-2-methyl-6-julolidyl-9-enyl-4H-pyran) can be used as emitter material.

As a fluorescent material, for example, 1,4-bis[2-(3-N-ethylcarbazoryl)vinyl] benzene or perylene substituted with at least one thiol group can be used. For example, the fluorescent material has one of the following structures:

The compounds can be prepared, for example, from appropriately substituted naphthalenes, for example by reaction with aluminum chloride. The respectively doubly substituted perylenes are examples in which two functional groups on opposite sides of the molecule are attached to the molecule of the emitter material.

As phosphorescent materials, it is also possible, for example, to use organometallic compounds, such as iridium complexes, for example blue-phosphorescing bis(3,5-difluoro-2-(2-pyridyl)phenyl-(2-carboxypyridyl)iridium (III), which are substituted with at least one thiol group.

As emitter materials it is also possible to use TADF (Thermally Activated Delayed Fluorescence) emitters which are substituted by at least one thiol group. The TADF emitters can be organic or organometallic compounds. For example, substituted with at least one thiol group, 9,9'-(4, 4'-sulfonylbis(4,1-phenylene))bis(3,6-di-tert-butyl-9H-carbazoles, 9,10-bis[N,N-di(p-tolyl)amino]anthracene or 2,8-di-tert-butyl-5,11-bis(4-tert-butylphenyl)-6,12-diphenyltetracene can be used.

According to an embodiment, the first light-emitting layer comprises different emitter materials. For example, the first light emitting layer may comprise emitter materials that generate radiation having a different peak wavelength. For example, the first light-emitting layer may comprise an emitter material having a peak wavelength in the blue region of the electromagnetic spectrum and an emitter material having a peak wavelength in the red region of the electromagnetic spectrum.

The use of a metal layer and a monolayer-producing emitter material in a first light-emitting layer increases the light output, that is to say the radiation coupled out to the surroundings, and thus increases the efficiency of the device. At the same time, this first light-emitting layer has a high stability due to its highly ordered structures as SAMs.

According to an embodiment, the first light-emitting layer consists of the emitter material.

The first light-emitting layer may, according to at least one embodiment, comprise a matrix material or consist of the matrix material and the emitter material.

According to an embodiment, the matrix material is selected from electron-transporting, hole-blocking, hole-transporting and/or electron-blocking materials. Thus, in addition to the radiation-generating properties, the first light-emitting layer also has electron-transporting, hole-blocking, hole-transporting and/or electron-blocking properties.

In an embodiment, the molecules of the matrix material are substituted with at least one functional group comprising sulfur or consisting of sulfur.

In an embodiment, the molecules of the matrix material of the first light-emitting layer are bonded to the metal of the metal layer by covalent bonds of the sulfur. In particular, there is a covalent metal-sulfur bond between the metal of the metal layer and the sulfur of the functional group of the matrix material. According to this embodiment, the emitter material and the matrix material of the first light-emitting layer are formed as a self-assembled monolayer.

According to an embodiment, the organic stack of layers comprises a second light-emitting layer. Between the first light-emitting layer and the second light-emitting layer, a metal layer is arranged whose surface is in direct contact with the first light-emitting layer. The first light emitting layer comprises an emitter material and a matrix material whose molecules are substituted with at least one functional group comprising sulfur. The sulfur of the functional group of the molecules of the emitter material and the matrix material is covalently bonded to the metal of the metal layer.

The fact that a layer is "arranged between two other layers" may mean here and in the following that the one layer is arranged immediately in direct mechanical and/or electrical contact or in indirect contact with one of the other two layers and in direct mechanical and/or electrical contact or electrical or in indirect contact with other layers. In the case of indirect contact, further layers can then be arranged between the one layer and at least one of the two other layers.

According to an embodiment, an electron-blocking and/or hole-transporting layer is arranged between the metal layer and the second light-emitting layer. The hole-transporting layer may, for example, be p-doped and, for example, be part of a charge carrier generation layer sequence which is arranged between the first and the second light-emitting layer. In particular, the first light-emitting layer in this embodiment comprises an emitter material and an electron-transporting and/or hole-blocking matrix material whose molecules are covalently bonded to the metal of the metal layer via the sulfur of the functional group. In this embodiment, the first light-emitting layer has the properties of an electron-transporting layer of a charge carrier generation layer sequence for the radiation-generating property. The metal layer in this embodiment may have the function of an intermediate layer of a charge carrier generation layer sequence.

According to an embodiment, the organic light-emitting device comprises a first light-emitting layer and a metal layer arranged above it. The molecules of the emitter material and the electron-transporting and/or hole-blocking matrix material of the first light-emitting layer are covalently bonded to the metal of the metal layer via the sulfur of the functional group. A hole-transporting layer and/or an electron-blocking layer is arranged above the metal layer. A second light-emitting layer is arranged above the hole-transporting layer and/or the electron-blocking layer.

The fact that a layer is arranged or applied "on" or "above" another layer may mean here and below that the one layer is arranged directly in direct mechanical and/or electrical contact with the other layer. Furthermore, it can also mean that the one layer is arranged indirectly on or above the other layer. In this case, further layers can then be arranged between the one and the other layer.

According to an embodiment, a hole-blocking and/or electron-transporting layer is arranged between the metal layer and the second light-emitting layer. The electron-transporting layer may for example be n-doped and, for example, be part of a charge carrier generation layer sequence which is arranged between the first and the second light-emitting layer. In particular, in this embodiment, the first light-emitting layer comprises an emitter material and a hole-transporting and/or electron-blocking matrix material whose molecules are covalently bonded to the metal of the metal layer via the sulfur of the functional group. The first light-emitting layer in this embodiment has the properties of a hole-transporting layer of a charge carrier generation layer sequence. The metal layer in this embodiment may have the function of an intermediate layer of a charge carrier generation layer sequence.

According to an embodiment, the organic light-emitting device comprises a first light-emitting layer and a metal layer arranged above it. The molecules of the emitter material and the hole-transporting and/or electron-blocking matrix material are covalently bonded to the metal of the metal layer via the sulfur of the functional group. An electron-transporting layer and/or a hole-blocking layer is arranged above the metal layer. A second light-emitting layer is arranged above the electron-transporting layer and/or the hole-blocking layer.

In accordance with at least one embodiment, the emitter material is amphiphilic. By amphiphilic is meant here and below that the emitter material or the molecules of the emitter material has or have a hydrophilic, i.e. water-loving, and a hydrophobic, that is water-repellent or lipophilic region. This means that this substance is well soluble in both polar and non-polar solvents. The transition dipole moments of the molecules of the emitter material taken together have an anisotropic orientation. In particular, the orientation factor $K_\theta$ is less than $1/3$. The angle $\theta$ is the angle between the respective transition dipole moment of the molecules of the emitter material and a layer normal N, wherein the layer normal N is arranged perpendicular to the first light-emitting layer. The orientation factor $K_\theta$ is averaged over all molecules of the emitter material. In particular, $<\cos^2 \theta>$ is less than 0.2; 0.1; 0.015; 0.001 or 0. In particular, the transition dipole moments taken together are arranged perpendicular to the layer normal with a maximum deviation of +/−45° from this perpendicular orientation. The transition dipole moments of the molecules may be combined alternatively or additionally with a deviation of up to +/−45°, for example +/−40°, +/−35°, +/−30°, +/−25°, +/−20°, +/−15°, +/−10° or +/−5° from this vertical orientation. In particular, on average all transition dipole moments of the radiative transitions of the molecules have a perpendicular arrangement +/−45° to the layer normal of the first light-emitting layer.

In an embodiment, the organic stack of layers comprises a charge-transporting layer. The charge transporting layer may be an electron transporting layer or a hole-transporting layer. The hole-transporting layer may be p-doped and the electron-transporting layer may be n-doped.

In an embodiment, the charge transporting layer has a hydrophilic surface. Preferably, the charge-transporting layer is in direct contact with the first light-emitting layer. In particular, the hydrophilic surface is in direct contact with the first light-emitting layer.

In an embodiment, the molecules of the emitter material are oriented such that the hydrophilic regions are facing the hydrophilic surface of the charge-transporting layer and the hydrophobic regions are facing away from the hydrophilic surface of the charge-transporting layer.

In an embodiment, the charge transporting layer has a hydrophobic surface. Preferably, the charge-transporting layer is in direct contact with the first light-emitting layer. In particular, the hydrophilic surface is in direct contact with the first light-emitting layer.

According to an embodiment, the molecules of the emitter material are oriented so that the hydrophobic areas are facing the hydrophobic surface of the charge-transporting layer and the hydrophilic areas are facing away from the hydrophobic surface.

In other words, by using amphiphilic emitter materials in the first light-emitting layer, alignment or orientation of the molecules of the emitter material of the first light-emitting layer is generated. The emitter material forms a self-assembling monolayer.

Typical hydrophilic regions on molecules of the emitter material may be selected from a group comprising carboxylate groups, hydroxyl groups, amine groups, amide groups, aldehyde groups, and sulfo groups. The hydrophilic surface of the charge-transporting, i.e. the hole-transporting or electron-transporting, layer can also comprise such group.

Typical hydrophobic substituents are alkyl substituents such as methyl or ethyl substituents or aromatic substituents such as a phenyl substituent. The hydrophobic surface of the charge-transporting, i.e. the hole-transporting or electron-transporting, layer can also comprise such group.

By using amphiphilic emitter materials in the first light-emitting layer, alignment or orientation of the emitter material in the first light-emitting layer can be generated. The amphiphilic molecules organize themselves in the layer due to energetic effects and their molecular structure. This self-organization of the emitter material causes the transition dipole moments of the radiation-generating transition of the molecules of the emitter material taken together in the first light-emitting layer to have an anisotropic orientation. In particular, the orientation factor $K_\theta$ is less than $1/3$. The transition dipole moments of the radiation-generating transition of the radiation-generating transition of the molecules of the emitter material are preferably arranged taken together perpendicular to a layer normal of the first light-emitting layer with a maximum deviation of +/−45° from this perpendicular orientation.

In an embodiment, the emitter material is a fluorescent or phosphorescent material. These materials are known to the person skilled artisan. In particular, these are substituted with a functional group comprising carboxylate groups, hydroxyl groups, amine groups, amide groups, aldehyde groups and sulfo groups. It is also possible that the functional groups are bonded to the emitter material via a spacer, preferably an aryl or alkyl group, such as, for example, a phenyl, methyl, ethyl or propyl group. For example, iridium complexes substituted with at least one functional group, such as green phosphorescent Ir(ppy)$_3$(tris(2-phenylpyridine) iridium III) and/or red phosphorescent Ru(dtb-bpy)$_3$*2(PF$_6$) (Tris[4,4'-di-tert-butyl-(2,2')-bipyridine]ruthenium(III) complex); and blue fluorescent DPAVBi (4,4-bis[4-(di-p-tolylamino)styryl]biphenyl), green fluorescent TTPA (9,10-bis[N,N-di(p-tolyl)amino]anthracene) and/or red fluorescent DCM2 (4-dicyanomethylene)-2-methyl-6-julolidyl-9-enyl-4H-pyran) can be used as emitter material.

As a fluorescent material, for example, 1,4-bis[2-(3-N-ethylcarbazoryl)vinyl]benzene or perylene substituted with a functional group comprising carboxylate groups, hydroxyl groups, thiol groups, amine groups, amide groups, aldehyde groups and sulfo groups. For example, the fluorescent material has one of the following structures:

The compounds can be prepared, for example, from appropriately substituted naphthalenes, for example by reaction with aluminum chloride.

As phosphorescent materials, for example, metal-organic compounds, such as iridium complexes, for example bis(3,5-difluoro-2-(2-pyridyl)phenyl-(2-carboxypyridyl)iridium (III), which are substituted with a functional group, comprising carboxylate groups, hydroxyl groups, thiol groups, amine groups, amide groups, aldehyde groups and sulfo groups.

As emitter materials it is also possible to use TADF (Thermally Activated Delayed Fluorescence) emitters which are substituted by a functional group which comprises carboxylate groups, hydroxyl groups, thiol groups, amine groups, amide groups, aldehyde groups and sulfo groups. The TADF emitters may be organic or organometallic compounds. For example, substituted with at least one functional group, 9,9'-(4,4'-sulfonylbis(4,1-phenylene))bis(3,6-di-tert-butyl-9H-carbazoles, 9,10-bis[N,N-di-(p-tolyl)-amino]anthracene or 2,8-di-tert-butyl-5,11-bis(4-tert-butylphenyl)-6,12-diphenyltetracene can be used.

Furthermore, a method of manufacturing an organic light-emitting device is specified. In particular, the method produces the organic light emitting device according to the above-mentioned embodiments. In this case, the previously described definitions and embodiments for the organic light-emitting device also apply to the method for producing the organic light-emitting device and vice versa.

In accordance with at least one embodiment, the method of manufacturing an organic light-emitting device comprises the following method steps:

A) Providing a first electrode,
B) Applying a metal layer or a charge-transporting layer to the first electrode,
C) Applying a first light-emitting layer to the layer produced in method step B). The first light-emitting layer in this case has an emitter material which is adapted to generate electromagnetic radiation during operation of the device and which arranges itself self-organizing during and/or after application, such that the transition dipole moments of the radiation-generating transition of the molecules of the emitter material taken together have an anisotropic orientation within the first light-emitting layer, and it applies <cos$^2$ θ> is less than ⅓, where θ is the angle between the respective transition dipole moment of the radiation-generating transition of the molecules of the emitter material and a layer normal of the first light-emitting layer,
G) Applying a second electrode to the first light-emitting layer.

In an embodiment, the charge-transporting layer from method step B) is an electron-transporting layer or a hole-transporting layer. The hole-transporting layer may be p-doped and the electron transporting layer may be n-doped.

In an embodiment, a metal layer is applied in method step B) and in method step C) the emitter material is applied to, in particular directly on, the metal layer, wherein the molecules of the emitter material are each substituted with at least one thiol group and the sulfur of the thiol group is covalently bonded to the metal the metal layer. The emitter material thus binds covalently via a metal-sulfur bond to the metal layer, in particular to the surface of the metal layer.

Due to the high affinity of the sulfur of the at least one thiol group of the emitter material to the metal, in particular to gold, of the metal layer, the molecules of the emitter material organize themselves in the first light-emitting layer and align themselves accordingly. The molecules thus spontaneously assemble into a highly ordered layer and form a self-assembled monolayer.

According to an embodiment, a charge-transporting layer having a hydrophobic or hydrophilic surface is applied in method step B), and in step C) the emitter material is applied to, in particular directly, the hydrophobic or hydrophilic surface of the charge-transporting layer, wherein the molecules of the emitter material each have a hydrophilic surface and hydrophobic region and are oriented such that the hydrophobic regions are facing the hydrophobic surface of the charge transporting layer and the hydrophilic regions are facing away from the hydrophobic surface of the charge transporting layer or the hydrophilic regions are facing the hydrophilic surface of the charge transporting layer and the hydrophobic ones are facing away from the hydrophilic surface of the charge-transporting layer.

The amphiphilic molecules organize themselves in the layer due to energetic effects and their molecular structure, forming a self-assembled monolayer. This aligns the molecules.

In accordance with at least one embodiment, the first light-emitting layer is generated in step C) from the gas phase. This can be done by means of vacuum evaporation. In this case, an aligned or oriented first light-emitting layer can be produced during the production without additional method steps being necessary. This leads to time and cost savings.

In accordance with at least one embodiment, the first light-emitting layer in method step C) is produced from the liquid phase. As a method, spin coating, screen printing, inkjet, gravure printing or flexographic printing can be used. In this case, an oriented first light-emitting layer can be produced during the production without additional method steps being necessary. This leads to time and cost savings.

The methods can be selected according to the viscosity, solvent, surface energy and/or wetting properties of the emitter material.

Additional materials may also be mixed into the first light-emitting layer to adjust the viscosity or surface energy. Above all, additional solvents or further fillers with polar and/or nonpolar groups and/or anionic surfactants are used. For example, fillers may be added which have functional groups selected from: carboxylate, sulphonate or sulphate.

In accordance with at least one embodiment, the orientation of the emitter material in method step C) takes place at temperatures between 20° C. and 120° C. Such temperatures are common in the production of organic electronics. At such high temperatures, orientation of molecules of emitter materials with external fields cannot be achieved. Therefore, according to the invention, self-assembly of the molecules of the emitter material is used here.

Furthermore, a higher efficiency is ensured with consistently high device stability compared to the prior art. In addition, the morphology can be influenced to improve the performance of the device. The influence on the morphology can achieved by the orientation of the emitter material.

Further, a device can be provided to provide potentially increased stability by uniformly orienting the molecules of the emitter material in the first light-emitting layer.

BRIEF DESCRIPTION OF THE DRAWINGS

Further advantages, advantageous embodiments and developments emerge from the embodiments described below in conjunction with the figures.

In the exemplary embodiments and figures, identical, corresponding or identically acting elements can each be provided with the same reference numerals. The illustrated elements and their proportions with each other are not to be regarded as true to scale, but individual elements, such as layers, devices, devices and areas, for better presentation and/or better understanding may be exaggerated.

Figure 1:
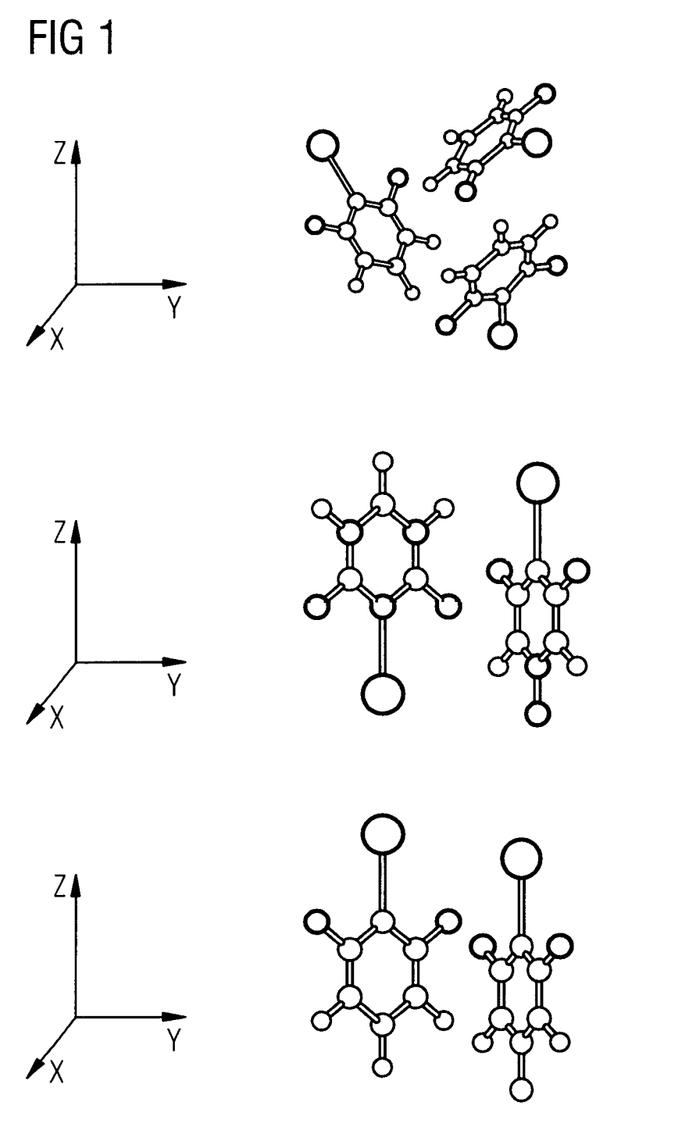
FIG. 1 shows various possible arrangements of molecules in space

FIG. 1 shows various possible arrangements of molecules in space. In the upper figure, the molecules are distributed isotropically, so they have no preferred direction. In the middle and lower images, the molecules are aligned along the z-axis. In addition, the molecules in the lower figure are oriented along the z-axis.

Figures 2, 3:
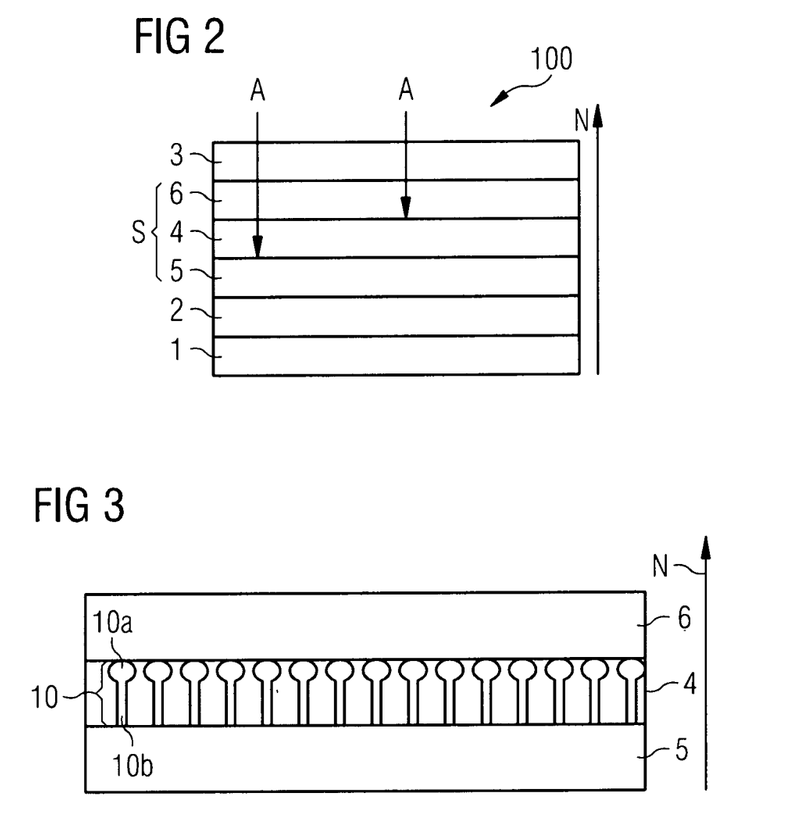
FIGS. 2, 5, 8, 9, 10 and 11 show schematic side views of exemplary embodiments of an organic light-emitting device.
FIGS. 3, 4, 6, 7, 12, 13, 14, 15 and 16 are schematic representations of a portion of an organic light-emitting device according to various embodiments.

FIG. 2 shows a schematic side view of an organic light-emitting device 100 according to an embodiment which has a substrate 1, for example made of glass. Above the substrate 1, an organic stack of layers S is arranged between an anode 2 and a cathode 3. The organic stack of layers S has two charge-transporting layers 5, 6, between which a first light-emitting layer 4 is arranged.

The anode 2 can be formed from indium tin oxide and the cathode 3 can be made of aluminum or silver. Above the anode 2, a hole-transporting layer 5 is arranged.

The hole-transporting layer 5 has a hydrophilic or hydrophobic surface A. The hydrophilic or hydrophobic surface A faces the light-emitting layer 4. Above the first light-emitting layer 4, an electron-transporting layer 6 is arranged. Alternatively, the electron-transporting layer 6 may have a hydrophilic or hydrophobic surface A. If the hole-transporting layer 5 has a hydrophilic surface, the electron-transporting layer 6 can have a hydrophobic surface A and vice versa.

Figure 4:
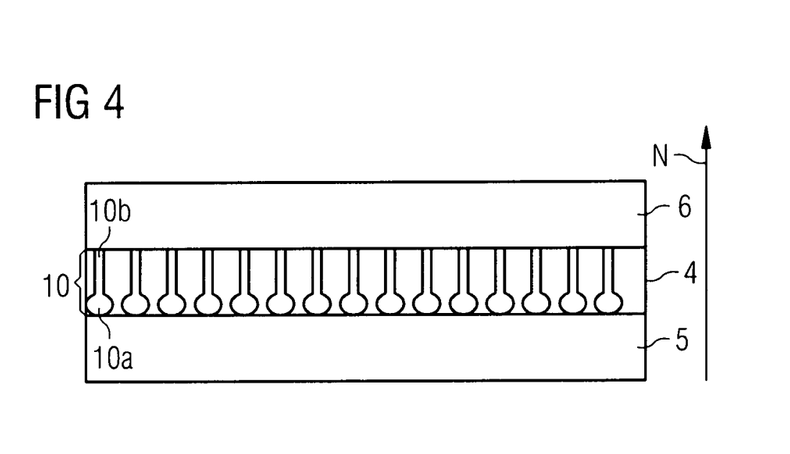

FIGS. 3 and 4 show a section of an organic light-emitting device 100 each according to an embodiment. Between the charge-transporting layers 5, 6, a hole-transporting layer 5 and an electron-transporting layer 6, a first light-emitting layer 4 is arranged. The first light-emitting layer 4 has an emitter material that is amphiphilic. Amphiphile here means that the molecules of the emitter material 10 have a hydrophilic region 10a and a hydrophobic region 10b.

The hole-transporting layer 5 in FIG. 3 has a hydrophobic surface, and the electron-transporting layer 6 may have a hydrophilic surface. Due to the hydrophobic surface of the hole-transporting layer 5, the amphiphilic emitter material aligns itself differently in space depending on the polarity. This means that the hydrophobic region 10b is oriented toward the hydrophobic surface of the hole-transporting layer 5 and that the hydrophilic region 10a of the emitter material is oriented in the direction of the electron-transporting layer 6. In this case, the surface of the electron-transporting layer 6 may be formed in particular hydrophilic. In this way, alignment or orientation of the emitter material in the first light-emitting layer 4 can be generated. The molecules are oriented such that the transition dipole moments of the radiation-generating transition of the molecules of the emitter material taken together have an anisotropic orientation within the first light-emitting layer and $<\cos^2 \theta>$ is less than $\frac{1}{3}$, where $\theta$ is the angle between the respective transition dipole moment of the radiation-generating transition of the molecules of the emitter material and a layer normal N of the first light-emitting layer 4. In particular, the transition dipole moments of the radiation-generating transition taken together are arranged perpendicularly to a layer normal N of the first light-emitting layer with a maximum deviation of +/−45° from this perpendicular orientation.

FIG. 4 shows the opposite case to FIG. 3. FIG. 4 shows that the hole-transporting layer 5 has a hydrophilic surface. The electron-transporting layer 6 may have a hydrophobic surface. In this way, alignment or orientation can be generated in the opposite direction to FIG. 3.

The sections shown in FIGS. 3 and 4 can be incorporated in an organic light-emitting device 100, as described, for example, in FIG. 1.

Figure 5:
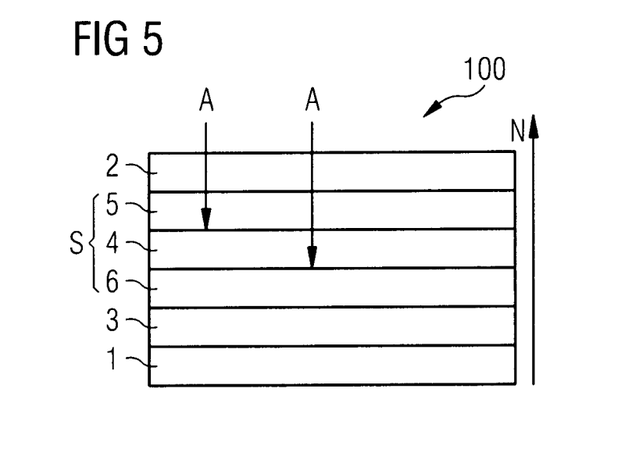

In comparison with the organic light-emitting device of FIG. 2, a cathode 3 is arranged above the substrate 1 in the embodiment of an organic light-emitting device 100 in FIG. 5. Over the cathode 3, an electron-transporting layer 6 is arranged.

The electron-transporting layer 6 has a hydrophilic or hydrophobic surface A. The hydrophilic or hydrophobic surface A faces the first light-emitting layer 4. Above the first light-emitting layer 4, a hole-transporting layer 5 is arranged. Alternatively, the hole-transporting layer 5 may have a hydrophilic or hydrophobic surface A. If the electron-transporting layer 6 has a hydrophilic surface, the hole-transporting layer 5 may have a hydrophobic surface A and vice versa.

Figure 6:
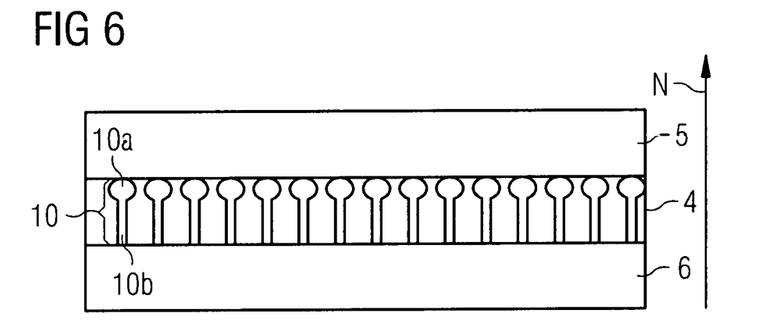
Figure 7:
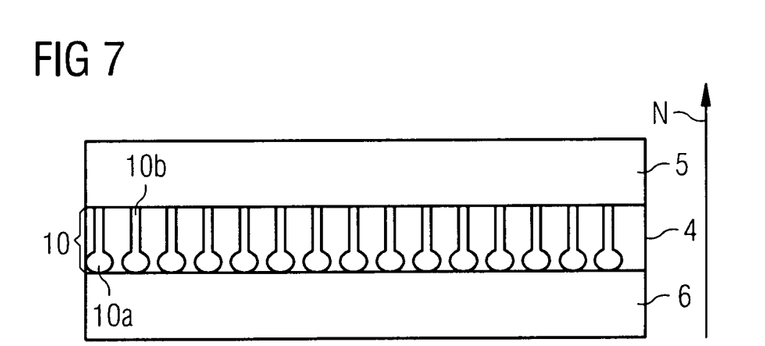

FIGS. 6 and 7 show a section of an organic light-emitting device 100 each according to an embodiment. Between the charge-transporting layers 5, 6, an electron-transporting layer 6 and a hole-transporting layer 5, a first light-emitting layer 4 is arranged. The first light-emitting layer 4 comprises an emitter material having a hydrophilic region 10a and a hydrophobic region 10b.

The electron-transporting layer 6 in FIG. 6 comprises a hydrophobic surface, and the hole-transporting layer 6 may comprise a hydrophilic surface. Due to the hydrophobic surface of the electron-transporting layer 6, the amphiphilic emitter material aligns in space depending on the polarity. This means that the hydrophobic region 10b is oriented toward the hydrophobic surface of the electron-transporting layer 6 and that the hydrophilic region 10b of the emitter material is oriented in the direction of the hole-transporting layer 5. In this case, the surface of the hole-transporting layer 5 may be formed in particular hydrophilic. In this way, alignment or orientation of the emitter material in the first light-emitting layer 4 can be generated. The molecules are oriented such that the transition dipole moments of the radiation-generating transition of the molecules of the emitter material taken together have an anisotropic alignment within the first light-emitting layer and $<\cos^2 \theta>$ less than $\frac{1}{3}$, where $\theta$ is the angle between the respective transition dipole moment of the radiation-generating transition of the molecules of the emitter material and a layer normal N of the first light-emitting layer 4. In particular, the transition dipole moments of the radiation-generating transition are taken together arranged perpendicularly to a layer normal N of the first light-emitting layer with a maximum deviation of +/−45° from this perpendicular orientation.

FIG. 7 shows the opposite case to FIG. 6. FIG. 7 shows that the electron-transporting layer 6 has a hydrophilic surface. The hole-transporting layer 5 may have a hydrophobic surface. In this way, alignment or orientation can be generated in the opposite direction to FIG. 6.

The sections shown in FIGS. 6 and 7 can be incorporated in an organic light-emitting device 100, as described, for example, in FIG. 5.

Figure 8:
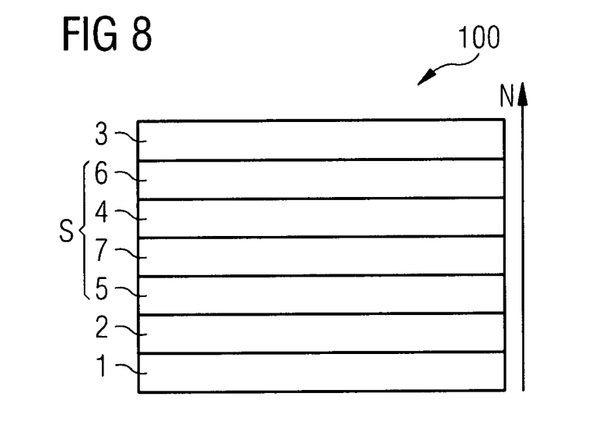

FIG. 8 shows a schematic side view of an organic light-emitting device 100 according to an embodiment which has a substrate 1, for example made of glass. Above the substrate 1, an organic stack of layers S is arranged between an anode 2 and a cathode 3. The organic stack of layers S has two charge-transporting layers 5, 6, between which a first light-emitting layer 4 is arranged. Between the first light-emitting layer 4 and the hole-transporting layer 5, a metal layer 7, preferably made of gold, is arranged.

Figure 9:
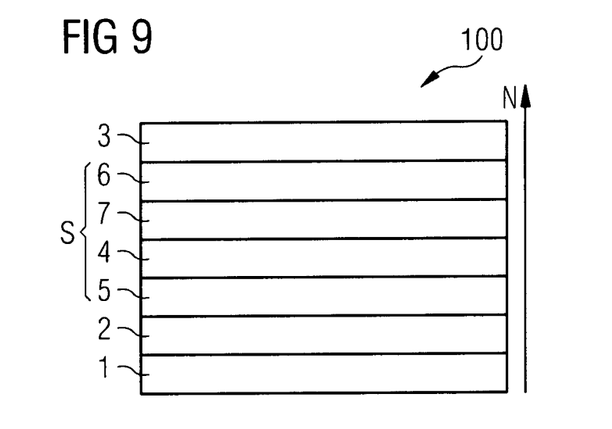

FIG. 9 shows a schematic side view of an organic light-emitting device 100 according to an embodiment. In comparison with the organic light-emitting device from FIG. 8, the metal layer 7 is arranged between the first light-emitting layer 4 and the electron-transporting layer 6.

In the devices of FIGS. 8 and 9, it is alternatively possible that the cathode 3 is arranged above the substrate 1, whereupon the electron-transporting layer 6 and then the hole-transporting layer 5 are arranged. In other words, the arrangement of the electrodes and the arrangement of the electron-transporting layer and the hole-transporting layer are reversed.

In the devices of FIGS. 8 and 9, the anode 2 may be formed from indium tin oxide and the cathode 3 from aluminum.

Figure 10:
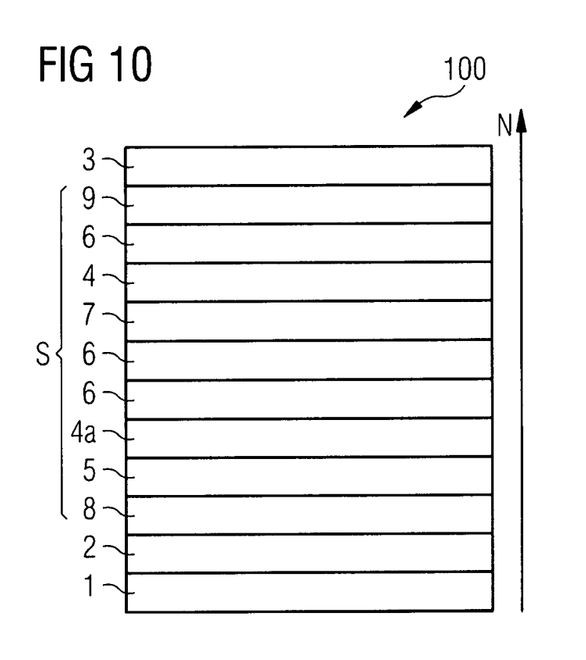

FIG. 10 shows a schematic side view of an organic light-emitting device 100 according to an embodiment which has a substrate 1, for example made of glass. Above the substrate 1, an organic stack of layers S is arranged between an anode 2 and a cathode 3. Above the anode 2, a hole-injecting layer 8 and a hole-transporting layer 5 are arranged. Above the hole-transporting layer 5, a second light-emitting layer 4a is arranged. Above the second light-emitting layer 4a, two electron-transporting layers 6 are arranged. This is followed by a metal layer 7, which is formed of a metal, preferably of gold.

Above the metal layer is a first light-emitting layer 4 is arranged, which comprises an emitter material which is adapted to generate electromagnetic radiation during operation of the device. The molecules of the emitter material of the first light-emitting layer 4 are substituted with sulfur and bonded to the gold of the metal layer 7 via covalent sulfur-gold bonds. The molecules are oriented such that the transition dipole moments of the radiation-generating transition of the molecules of the emitter material taken together have an anisotropic alignment within the first light-emitting layer and $<\cos^2 \theta>$ is less than $\frac{1}{3}$, where $\theta$ is the angle between the respective transition dipole moment of the radiation-generating transition of the molecules of the emitter material and a layer normal N of the first light-emitting layer 4. In particular, the transition dipole moments of the radiation-generating transition taken together are arranged perpendicularly to a layer normal N of the first light-emitting layer with a maximum deviation of +/−45° from this perpendicular orientation. The first light-emitting layer 4 also comprises a hole-transporting matrix material. The molecules of the matrix material are substituted with sulfur and bonded to the gold of the metal layer 7 via covalent sulfur-gold bonds. Above the first light-emitting layer 4 there is arranged an electron-transporting layer 6 and above this an electron-injecting layer 9.

The device according to FIG. 10 can be referred to as a stacked OLED. In stacked OLEDs, the charge generation usually involves a charge-generating layer sequence comprising an electron-transporting layer, an intermediate layer and a hole-transporting layer between two light-emitting layers. In the device 100 in FIG. 10, this structure corresponds to the electron-transporting layer 6 followed by the metal layer 7 and the first light-emitting layer 4, which is additionally formed to be hole-transporting through the hole-transporting matrix material. Thus, the metal layer 7 serves as a seed layer for the self-assembly of the molecules of the emitter material and the matrix material and as a so-called intermediate layer of a CGL.

Figure 11:
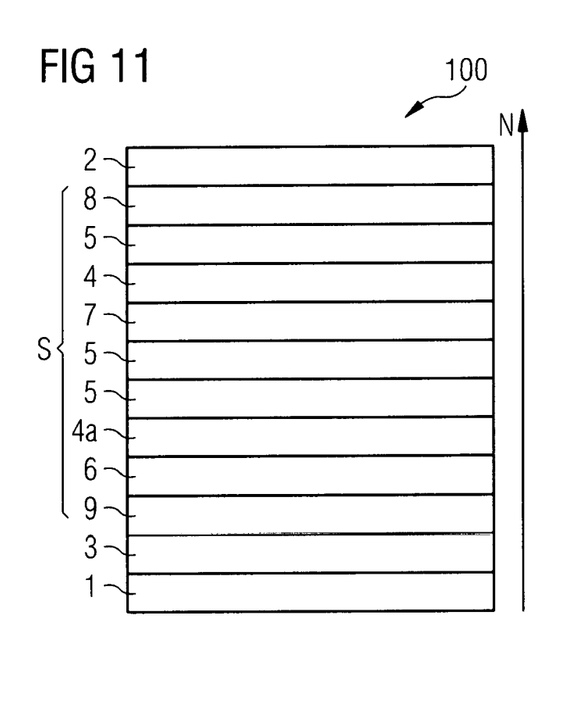

FIG. 11 shows a schematic side view of an organic light-emitting device 100 according to an embodiment, which comprises a substrate 1, for example made of glass. Over the substrate 1, an organic stack of layers S is formed between the cathode 3 and an anode 2. Over the cathode 3, an electron-injecting layer 9 and an electron-transporting layer 6 are arranged. Above the electron-transporting layer 6, a second light-emitting layer 4a is arranged. Above the second light-emitting layer 4a, two hole-transporting layers 5 are arranged. This is followed by a metal layer 7, which is formed of a metal, preferably of gold. Arranged above the metal layer 7 is a first light-emitting layer 4 which comprises an emitter material which is adapted to generate electromagnetic radiation during operation of the device.

The molecules of the emitter material are substituted with sulfur and bonded via covalent sulfur-gold bonds to the gold of the metal layer 7. The molecules are oriented such that the transition dipole moments of the radiation-generating transition of the molecules of the emitter material taken together have an anisotropic orientation within the first light-emitting layer and $<\cos^2 \theta>$ less than $\frac{1}{3}$, where $\theta$ is the angle between the respective transition dipole moment of the radiation-generating transition of the molecules of the emitter material and a layer normal N of the first light-emitting layer 4. In particular, the transition dipole moments of the radiation-generating transition taken together are arranged perpendicularly to a layer normal N of the first light-emitting layer with a maximum deviation of +/−45° from this perpendicular orientation. The first light-emitting layer 4 also has a hole-transporting matrix material. The molecules of the matrix material are substituted with sulfur and bonded to the gold of the metal layer 7 via covalent sulfur-gold bonds. Above the first light-emitting layer 4 is a hole-transporting layer 5 and above this a hole-injecting layer 8 is arranged.

In the device 100 in FIG. 11, the arrangement of the hole-transporting layer 5 followed by the metal layer 7 and the first light emitting layer 4, which is also electron transporting by the electron transporting matrix material, corresponds to a GCL consisting of a hole transporting layer, an intermediate layer and an electron transporting layer. Thus, the metal layer 7 serves as a seed layer for the self-assembly of the molecules of the emitter material and the matrix material and as a so-called intermediate layer of a CGL.

Figure 12:
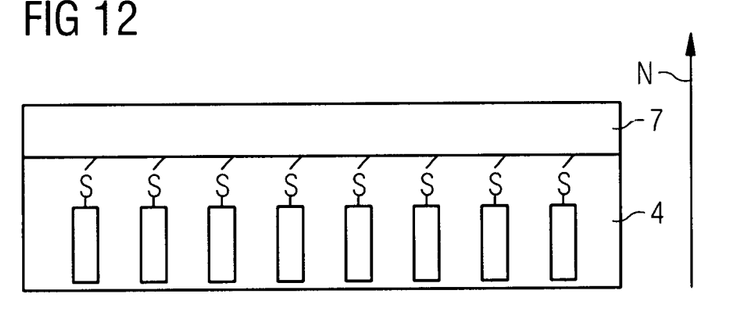
Figure 13:
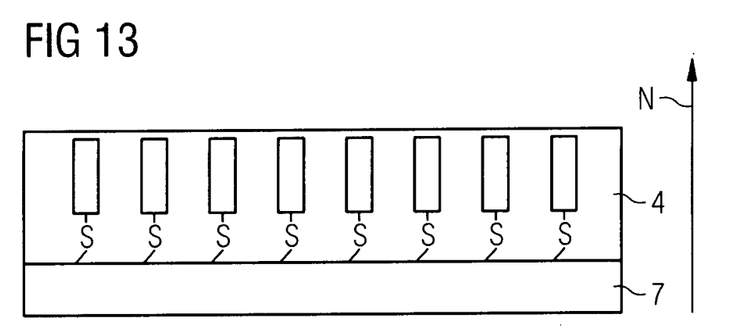

FIGS. 12 and 13 show a section of an organic light-emitting device 100 each according to an embodiment. FIGS. 12 and 13 show a first light-emitting layer 4. A metal layer 7 is arranged directly adjacent to the first light-emitting layer 4. The metal layer 7 is in particular made of gold. The first light emitting layer 4 includes an emitter material configured to generate electromagnetic radiation during operation of the device. The molecules of the emitter material are substituted with sulfur and bonded via covalent sulfur-gold bonds to the gold of the metal layer 7. The molecules of the emitter material are oriented such that the transition dipole moments of the radiation-generating transition of the molecules of the emitter material taken together have an anisotropic orientation within the first light-emitting layer and $<\cos^2 \theta>$ is less than $\frac{1}{3}$, where $\theta$ is the angle between the respective transition dipole moment of the radiation-generating transition of the molecules of the emitter material and a layer normal N of the first light-emitting layer 4. In particular, the transition dipole moments of the radiation-generating transition taken together are arranged perpendicularly to a layer normal N of the first light-emitting layer with a maximum deviation of +/−45° from this perpendicular orientation.

The sections shown in FIGS. 12 and 13 may be incorporated in an organic light-emitting device 100 as described, for example, in FIGS. 8, 9, 10 and 11.

If the section shown in FIG. 13 is introduced in a device of FIG. 10, the first light-emitting layer 4 may additionally have a hole-transporting matrix material. The molecules of the matrix material are substituted with sulfur and bonded to the gold of the metal layer 7 via covalent sulfur-gold bonds.

If the detail shown in FIG. 13 is introduced in a device of FIG. 11, the first light-emitting layer 4 may additionally have an electron-transporting matrix material. The molecules of the matrix material are substituted with sulfur and bonded to the gold of the metal layer 7 via covalent sulfur-gold bonds.

Furthermore, an encapsulation arrangement, preferably in the form of a thin-layer encapsulation, may be applied to the electrodes 2, 3 and the organic functional stack of layers S in the light-emitting devices of FIGS. 2, 5, 8, 9, 10 and 11 (not shown) in order to protect the organic light emitting device 100 and in particular the layers of the organic functional stack of layers S and the electrodes 2, 3 against damaging materials from the environment such as moisture and/or oxygen and/or other corrosive substances such as hydrogen sulfide.

Figure 14:
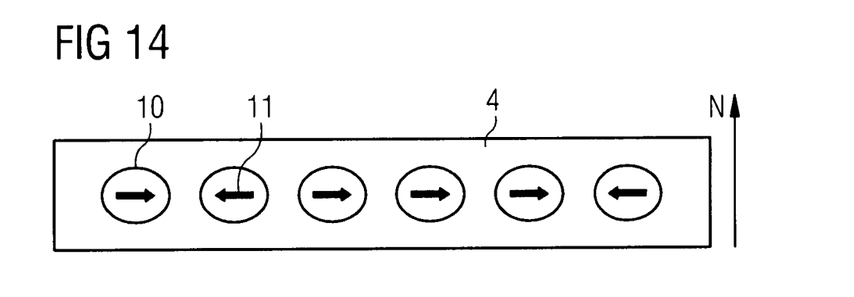
Figure 15:
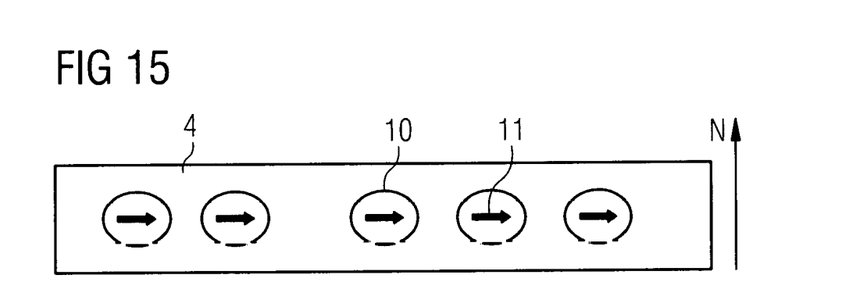
Figure 16:
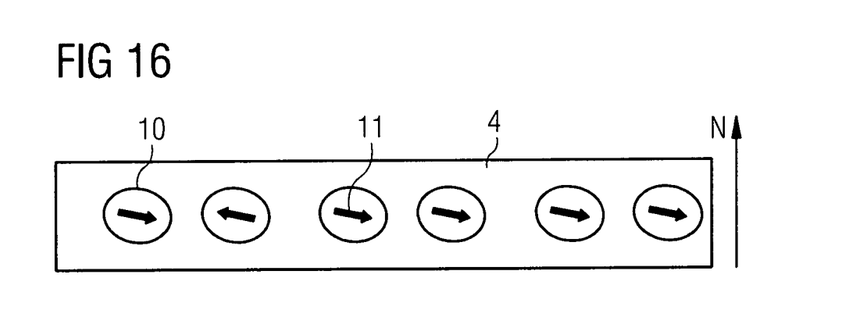

FIGS. 14, 15 and 16 each show a section of an organic light-emitting device 100 according to an embodiment. The figures each show a first light-emitting layer 4, which comprises an emitter material. The molecules of the emitter material 10 each have a transition dipole moment 11 for the radiation-generating transition, which generates electromagnetic radiation during operation of the device.

FIGS. 14 and 15 show that the transition dipole moments 11 are arranged perpendicular to the layer normal N of the first light-emitting layer. FIG. 16 shows that the transition dipole moments 11 have a deviation of approximately 10° from the perpendicular arrangement to the layer normal N. By aligning the transition dipole moments of the radiation-generating transition, the generated radiation is radiated anisotropically and thus advantageously meets at an angle through the other layers that no or almost no total reflection of the radiation occurs at the interfaces of the layers with each other or the ambient air and thus more radiation is decoupled to the outside. This increases the efficiency of the device and the degree of polarization of the generated radiation.

The sections shown in FIGS. 14, 15 and 16 may be incorporated in an organic light-emitting device 100 as described, for example, in FIGS. 2, 5, 8, 9, 10 and 11.

The embodiments described in connection with the figures and their features can also be combined with each other according to further embodiments, even if such combinations are not explicitly shown in the figures. Furthermore, the embodiments described in connection with the figures may have additional or alternative features as described in the general part.

The invention is not limited by the description by means of the embodiments. Rather, the invention encompasses any novel feature as well as any combination of features, which includes in particular any combination of features in the patent claims, even if this feature or combination itself is not explicitly stated in the patent claims or exemplary embodiments.

REFERENCE NUMERALS 1 substrate
2 anode
3 cathode
4 first light-emitting layer
4a second light-emitting layer
5 hole-transporting layer
6 electron-transporting layer
5,6 charge transporting layer
7 metal layer
8 hole-injecting layer 9 electron-injecting layer
10 molecule of emitter material
10a hydrophilic region
10b hydrophobic region
11 transitional dipole moment
100 organic light-emitting device
A hydrophilic or hydrophobic surface
N layer normal of the first light-emitting layer
S organic stack of layers

The invention claimed is:

1. An organic light-emitting device comprising an organic stack of layers between two electrodes, wherein the organic stack of layers comprises a first light-emitting layer and
the first light-emitting layer comprises an emitter material adapted to generate electromagnetic radiation during operation of the device and wherein the transition_dipole moments of the radiation-generating transition of the molecules of the emitter material taken together have an anisotropic orientation within the first light emitting layer and it applies that $<\cos^2 \theta>$ is less than $\frac{1}{3}$, where $\theta$ is the angle between the respective transition dipole moment of the radiation generating transition of the molecules of the emitter material and a layer normal of the first light emitting layer and wherein the organic stack of layers comprises a metal layer and the molecules of the emitter material are bonded to the metal of the metal layer by covalent bonds.

2. Organic light-emitting device according to claim 1, wherein more than 80% of all transition dipole moments of the molecules of the emitter material are arranged perpendicular to the layer normal of the first light-emitting layer with a deviation of at most ±45° from this perpendicular orientation.

3. Organic light-emitting device according to claim 1, wherein the molecules of the emitter material are substituted with at least one functional group comprising sulfur and the molecules of the emitter material are bonded to the metal of the metal layer via covalent bonds of the sulfur.

4. Organic light-emitting device according to claim 1, wherein the metal of the metal layer is selected from a group comprising copper, silver, gold, aluminum, platinum and combinations thereof.

5. Organic light-emitting device according to claim 1, wherein the metal layer has a layer thickness between 0.1 nm and 3 nm inclusive.

6. Organic light-emitting device according to claim 1, wherein the organic stack of layers comprises a second light-emitting layer and wherein the first light-emitting layer comprises an electron or hole-transporting matrix material and the molecules of the matrix material are bonded to the metal of the metal layer by covalent bonds.

7. Organic light-emitting device according to claims 1, wherein the emitter material is amphiphilic.

8. Organic light-emitting device according to claim 7, wherein the organic stack of layers comprises a charge transporting layer comprising a hydrophilic surface and the molecules of the emitter material have hydrophilic regions and hydrophobic regions and wherein the molecules of the emitter material are oriented such that the hydrophilic regions are facing the hydrophilic surface and the hydrophobic regions are facing away from the hydrophilic surface.

9. Organic light-emitting device according to claim 7, wherein the organic stack of layers comprises a charge transporting layer comprising a hydrophobic surface and the molecules of the emitter material have hydrophilic regions and hydrophobic regions and wherein the molecules of the emitter material are oriented such that the hydrophobic regions are facing the hydrophobic surface and the hydrophilic regions are facing away from the hydrophobic surface.

10. A method of manufacturing an organic light-emitting device according to claim 1 comprising the method steps:
A) Providing an electrode,
B) Applying a metal layer to the electrode,
C) Applying a first light-emitting layer to the metal layer produced in method step B), wherein the light-emitting layer comprises an emitter material which is adapted to generate electromagnetic radiation during operation of the device and which arranges itself self-organizing during and/or after application, such that the transition dipole moments of the radiation-generating transition of the molecules of the emitter material taken together have an anisotropic orientation within the first light-emitting layer and it applies that $<\cos^2 \theta>$ is less than $\frac{1}{3}$, where $\theta$ is the angle between the respective transition dipole moment of the radiation-generating transition of the molecules of the emitter material and a layer normal of the first light-emitting layer, wherein the molecules of the emitter material are each substituted with at least one thiol group and the sulfur of the thiol group is covalently bonded to the metal of the metal layer,
G) Applying a second electrode to the first light-emitting layer.

11. Method according to claim 10, wherein in method step B) a charge transporting layer with a hydrophobic or hydrophilic surface is applied and wherein in method step C) the emitter material is applied to the hydrophobic or hydrophilic surface of the charge transporting layer and wherein the molecules of the emitter material have hydrophilic regions and hydrophobic regions and the molecules are oriented in a way, such that the hydrophobic regions are facing the hydrophobic surface of the charge-transporting layer and the hydrophilic regions are facing away from the hydrophobic surface of the charge-transporting layer or
such that the hydrophilic regions are facing the hydrophilic surface of the charge-transporting layer and the hydrophobic regions are facing away from the hydrophilic surface of the charge-transporting layer.

12. Method according to claim 10, wherein in method step C) the first light-emitting layer is applied from the liquid phase by means of spin coating, screen printing, inkjet, engraving or flexographic printing.

13. Method according to claim 10, wherein the first light-emitting layer is applied from the gas phase in method step C) by means of vacuum evaporation.

14. An organic light-emitting device comprising an organic stack of layers between two electrodes, wherein the organic stack of layers comprises a first light-emitting layer and
the first light-emitting layer comprises an emitter material adapted to generate electromagnetic radiation during operation of the device and wherein the transition dipole moments of the radiation-generating transition of the molecules of the emitter material taken together have an anisotropic orientation within the first light emitting layer and it applies that $<\cos^2 \theta>$ is less than $\frac{1}{3}$, where $\theta$ is the angle between the respective transition dipole moment of the radiation generating transition of the molecules of the emitter material and a layer normal of the first light emitting layer,
wherein the emitter material is amphiphilic,
wherein the organic stack of layers comprises a charge transporting layer comprising a hydrophilic surface and the molecules of the emitter material have hydrophilic regions and hydrophobic regions and wherein the molecules of the emitter material are oriented such that the hydrophilic regions are facing the hydrophilic surface and the hydrophobic regions are facing away from the hydrophilic surface or wherein the organic stack of layers comprises a charge transporting layer comprising a hydrophobic surface and the molecules of the emitter material have hydrophilic regions and hydrophobic regions and wherein the molecules of the emitter material are oriented such that the hydrophobic regions are facing the hydrophobic surface and the hydrophilic regions are facing away from the hydrophobic surface.

\* \* \* \* \*